United States Patent
Lin

(10) Patent No.: US 6,964,831 B2
(45) Date of Patent: Nov. 15, 2005

(54) METHOD OF FABRICATING POLYSILICON FILM BY EXCIMER LASER CRYSTALLIZATION PROCESS

(75) Inventor: Kun-chih Lin, Hsin-Chu Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 118 days.

(21) Appl. No.: 10/604,485

(22) Filed: Jul. 25, 2003

(65) Prior Publication Data

US 2004/0222187 A1 Nov. 11, 2004

(30) Foreign Application Priority Data

May 2, 2003 (TW) ................................ 92112079 A

(51) Int. Cl.7 .............................. G03F 9/00; G03C 5/00
(52) U.S. Cl. ........................ 430/22; 430/313; 430/314; 430/316; 430/317; 430/330; 430/945; 438/166; 438/482; 438/486; 438/487; 438/488; 216/65
(58) Field of Search .......................... 430/22, 313, 314, 430/316, 317, 330, 945; 438/166, 482, 486, 438/487, 488; 216/65

(56) References Cited

U.S. PATENT DOCUMENTS

| | | | | |
|---|---|---|---|---|
| 5,705,413 A | * | 1/1998 | Harkin et al. | 438/155 |
| 6,426,245 B1 | * | 7/2002 | Kawasaki et al. | 438/166 |
| 2004/0235276 A1 | * | 11/2004 | Lin | 438/487 |

* cited by examiner

*Primary Examiner*—Christopher G. Young
(74) *Attorney, Agent, or Firm*—Winston Hsu

(57) ABSTRACT

A method of fabricating a polysilicon film by an excimer laser crystallization process is disclosed. First, a substrate with a first region, a second region surrounding the first region, and a third region is provided. An amorphous silicon film is formed on the substrate. A photo-etching process is performed to remove parts of amorphous silicon film in the third region to form an alignment mark. Then, a mask layer is formed on the amorphous silicon film and a second photo-etching process is performed to remove the mask layer in the first region to expose the amorphous silicon film in the first region. After that, an excimer laser irradiation process is performed so that the amorphous silicon film in the first region is crystallized and becomes a polysilicon film.

20 Claims, 11 Drawing Sheets

__US 6,964,831 B2__

METHOD OF FABRICATING POLYSILICON FILM BY EXCIMER LASER CRYSTALLIZATION PROCESS

BACKGROUND OF INVENTION

1. Field of the Invention

The present invention relates to a method of fabricating a polysilicon film, and more particularly, to a method of fabricating a polysilicon film by an excimer laser crystallization (ELC) process.

2. Description of the Prior Art

The progress of science and technology has led to small, effective, and portable intelligent information products becoming a part of our lives. Display devices play an important role because all intelligent information products, such as mobile phones, personal digital assistants (PDAs), or notebooks, need display devices to be a communication interface. However, the fully developed amorphous silicon thin film transistor liquid crystal display (a-Si TFT LCD) devices, which are restricted in their carrier transfer rate, have difficulty in meeting the requirements of being thin, being power saving, and having high resolution. Therefore, the a-Si TFT LCD devices are gradually replaced by low temperature polysilicon (LTPS) thin film transistor liquid crystal display (TFT LCD) devices.

In the liquid crystal display devices, since a normal glass substrate can only work at a temperature below 600° C., fabricating a polysilicon film directly under a high temperature will make the glass substrate twisted. Thus, in a conventional method of fabricating a polysilicon thin film transistor, an expensive quartz substrate is needed and only a small size liquid crystal display panel can be made. Recently, a method of forming a low temperature polysilicon film by crystallizing an amorphous silicon film is gradually developed. Among the methods of forming polysilicon film, the excimer laser crystallization process is the major focus.

Furthermore, a plurality of low temperature polysilicon thin film transistors arranged in a matrix form is disposed on the LCD panel for driving the pixel electrodes in the LCD panel to display images. Thus, the polysilicon film normally comprises a plurality of polysilicon islands. Each of the polysilicon islands functions as an active area to form a source, a drain, and a channel region of each low temperature polysilicon thin film transistor.

For clarity, only one polysilicon island is illustrated in following diagrams to show a conventional method of fabricating a polysilicon film by an excimer laser crystallization process though the polysilicon film comprises a plurality of polysilicon islands in fact. Referring FIG. 1 to FIG. 4, which are schematic diagrams of a method of fabricating a polysilicon film by an excimer laser crystallization process according to prior art. As shown in FIG. 1, a display panel 10 comprising a substrate 12 is first provided. Then, a sputtering process is performed to form a metal layer on the substrate 12. A first photo-etching process is followed to pattern the metal layer and form an alignment mark 14 on the surface of the substrate 12. In the preferred embodiment of the present invention, the substrate is a glass substrate. The alignment mark 14 comprises at least an uneven structure disposed in a peripheral region of the substrate 12 which is not used for circuit layout. Therefore, the alignment mark 14 can be recognized by working machines clearly after performing a plurality of deposition processes.

A plurality of lithography processes are typically used in the fabricating process of the polysilicon film and the following manufacturing process of the display panel. If there is any bias present in the lithography processes, the device reliability is deteriorated and the device is malfunctioned if some serious defects occur. Therefore, in order to improve the alignment ability, the working machines have to align themselves according to the alignment mark 14 before performing any operations, especially the lithography process, reducing the possibility of generating defect due to misalignment.

As shown in FIG. 2, a buffer layer 16 and an amorphous silicon film 18 are formed on the surface of the substrate in turn. The amorphous silicon film 18 is defined with a first region 20 and second region 30. As shown in FIG. 3, a patterned mask layer 22 is formed on the second region 30. The mask layer 22 may have a single layer structure composed of a metal layer or a silicon nitride layer, or a multi-layer structure composed of a combination of materials mentioned above. The mask layer 22 can utilize the metal layer to increase the reflection rate of the second region 30 to reduce the heat absorption of the amorphous silicon film 18 or use the high heat dissipation of the silicon nitride layer to make the amorphous silicon film 18 with the mask layer 22 covering thereon generate grains first. Generally speaking, the formation of the mask layer 22 is used for making the amorphous silicon film 18 in the second region 30, which is covered by the mask layer 22, become partially melted and the amorphous silicon film 18 in the first region 20, which is not covered by the mask layer 22, become completely melted. Thus, when the melted amorphous silicon film 18 solidifies after the excimer laser irradiation is finished, a nucleation will happen based on the partially melted region since there is a heterogeneous interface between the partially melted region and the completely melted region. Grains are grown laterally from the second region 30, which is partially melted, toward the first region 20, which is completely melted, to form a polysilicon film 24 in the first region 20.

As shown in FIG. 4, a photo-etching process is followed to remove the mask layer 22 and the amorphous silicon film 18 in the second region 30 to form a polysilicon island 24 in the first region 20. After that, latter processes of liquid crystal panel manufacturing are performed while the polysilicon island 24 is used as an active area to form a driving circuit of the display panel 10.

In the aforementioned excimer laser crystallization process, the lithography process is needed for the steps of defining the position of the alignment mark 14, patterning the mask layer 22, and forming the polysilicon island 24. In other words, total three lithography processes are used in fabricating the polysilicon island 24. Although the aforementioned method can control the position of the grain boundary, the fabricating process is complex, leading to more fabricating time and cost. Thus, there is a strong need to simplify the excimer laser crystallization process.

SUMMARY OF INVENTION

It is therefore a primary objective of the claimed invention to provide a method of fabricating a polysilicon film by an excimer laser crystallization process so as to solve the aforementioned problem.

In a preferred embodiment, the claimed invention provides a method of fabricating a polysilicon film by an excimer laser crystallization process. First, a substrate defined with a first region, a second region surrounding the first region, and a third region is provided. An amorphous silicon film is formed on the substrate. Then, a first photo-etching process is followed to remove part of the amorphous film in the third region and form an alignment mark in the third region. After that, a mask layer is formed on the amorphous silicon film. A second photo-etching process is performed to remove the mask layer in the first region. An excimer laser crystallization process is then performed to make the amorphous film in the first region crystallize to a polysilicon film. Then, an etching process is performed to remove the mask layer.

It is an advantage of the claimed invention that the method can form a polysilicon island with a controlled grain boundary by using two lithography processes, simplifying the fabricating process effectively and solving the prior art problem of having a complex process so as to reduce the manufacturing cost and the fabricating time.

These and other objectives of the claimed invention will no doubt become obvious to those of ordinary skill in the art after reading the following detailed description of the preferred embodiment which is illustrated in the various figures and drawings.

DETAILED DESCRIPTION

Figure 1:
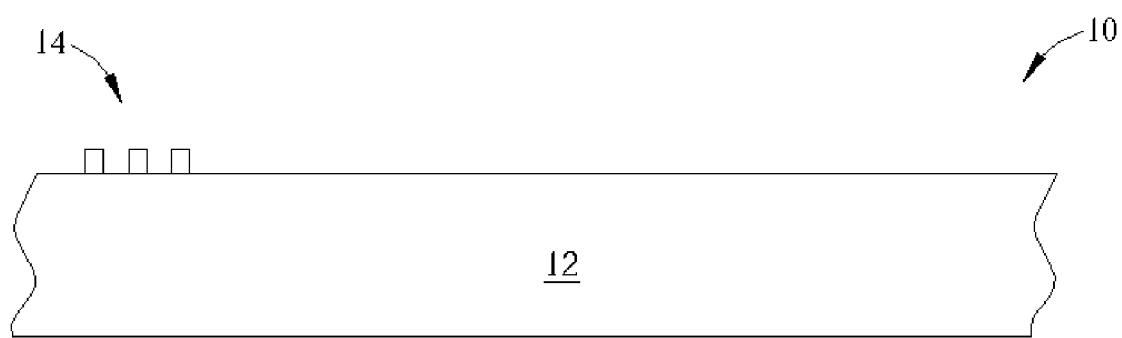
FIG. 1 to FIG. 4 are schematic diagrams of fabricating a polysilicon film by an excimer laser crystallization process according to prior art.
Figure 2:
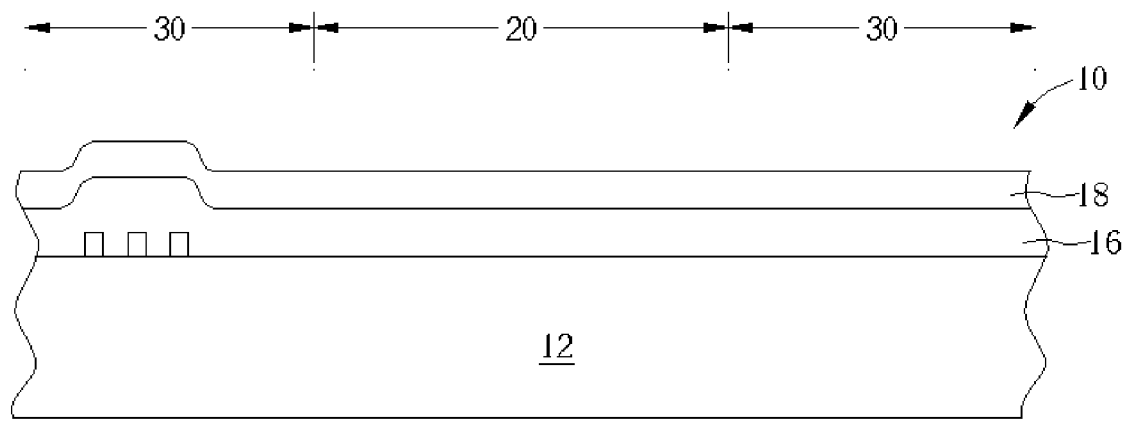
Figure 3:
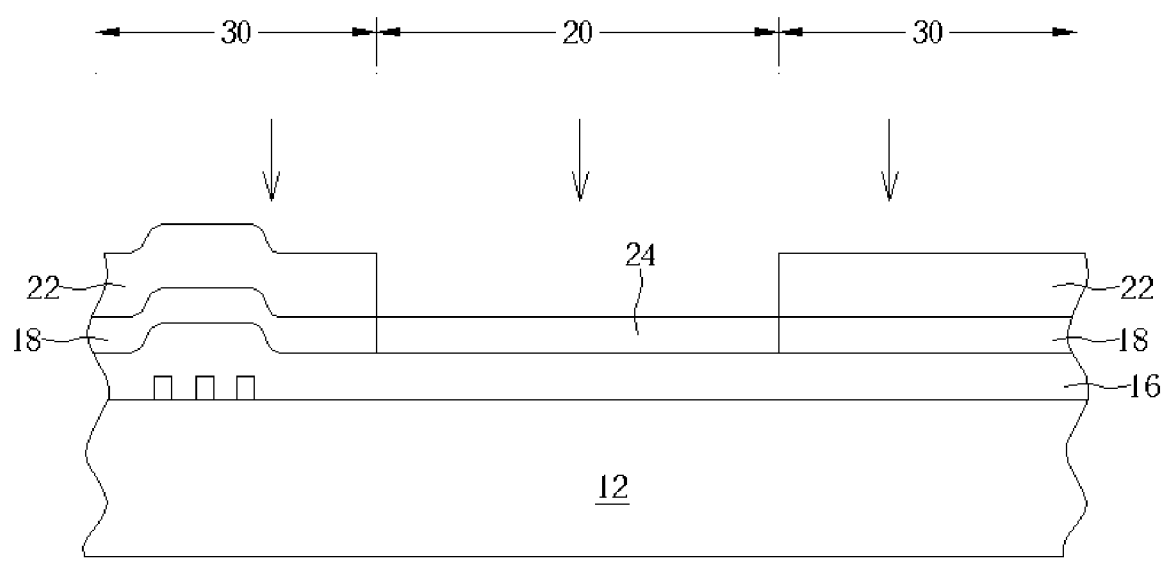
Figure 4:
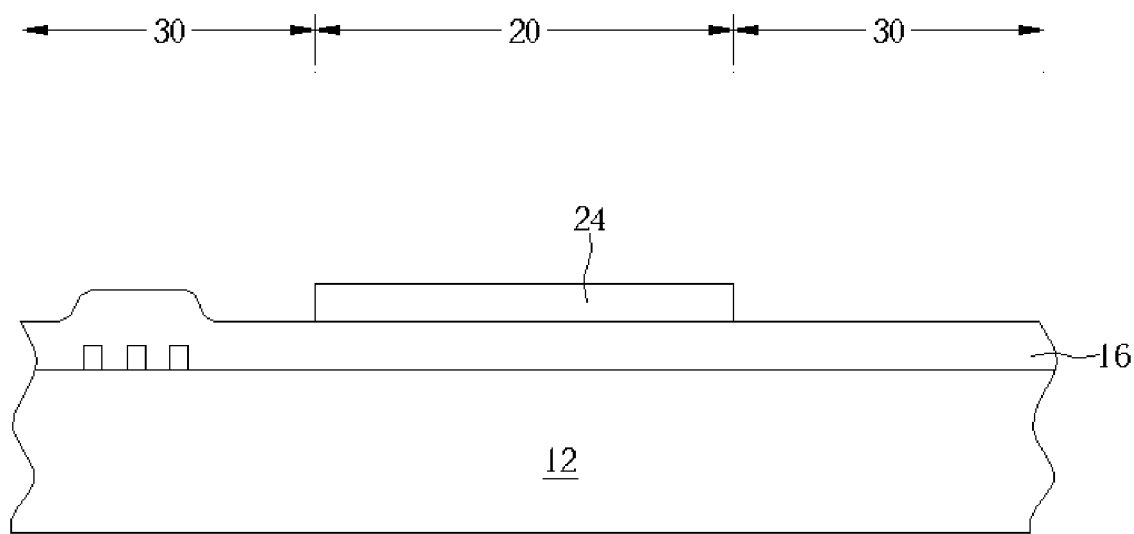
Figure 5:
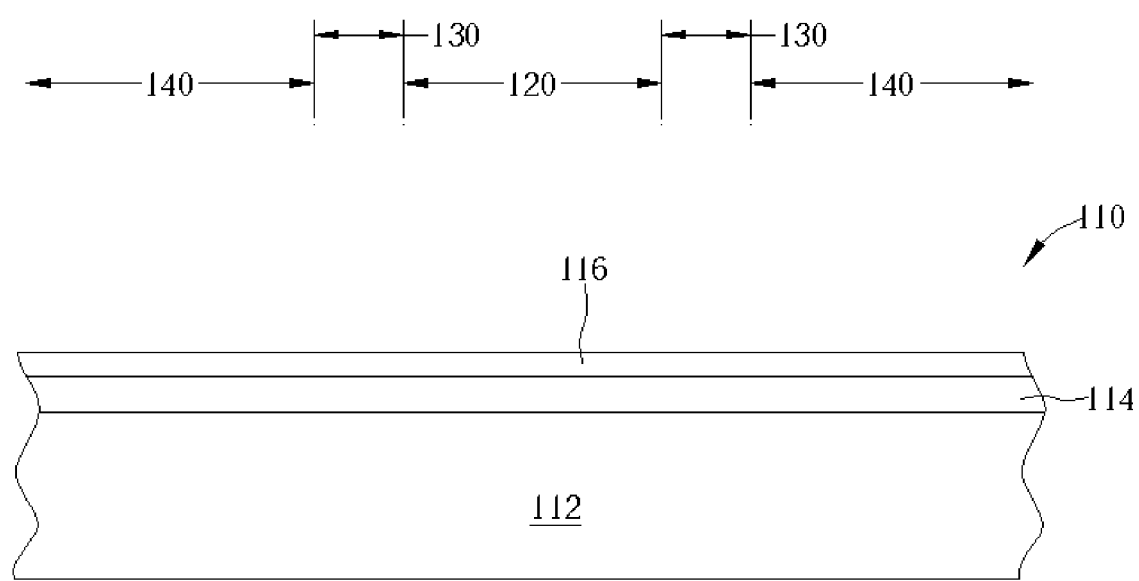
FIG. 5 to FIG. 9 are schematic diagrams of fabricating a polysilicon film by an excimer laser crystallization process according to a first embodiment of the present invention.

Please refer to FIG. 5 to FIG. 9, which are schematic diagrams of fabricating a polysilicon film by an excimer laser crystallization process according to a first embodiment of the present invention. As shown in FIG. 5, a display panel 110 comprising a substrate 112 is provided. The substrate 112 is defined with a first region 120, a second region 130 surrounding the first region 120, and a third region 140 in the surface of the substrate 112. A buffer layer 114 is formed on the substrate 112 for preventing impurities in the substrate 112 from diffusing upward and affecting the performance of the polysilicon film formed in latter processes. Next, an amorphous silicon film 116 is formed on the buffer layer 114. In the preferred embodiment of the present invention, the substrate 110 is a glass substrate and the buffer layer 114 is a silicon oxide layer or a multi-layer structure composed of a silicon oxide layer and a silicon nitride layer. A plurality of methods can be used to form the aforementioned layers, such as a low pressure chemical vapor deposition (LPCVD) process, plasma enhanced chemical vapor deposition (PECVD) process, or sputtering process. The methods are not described in detail since they are standard processes for this field.

Figure 6:
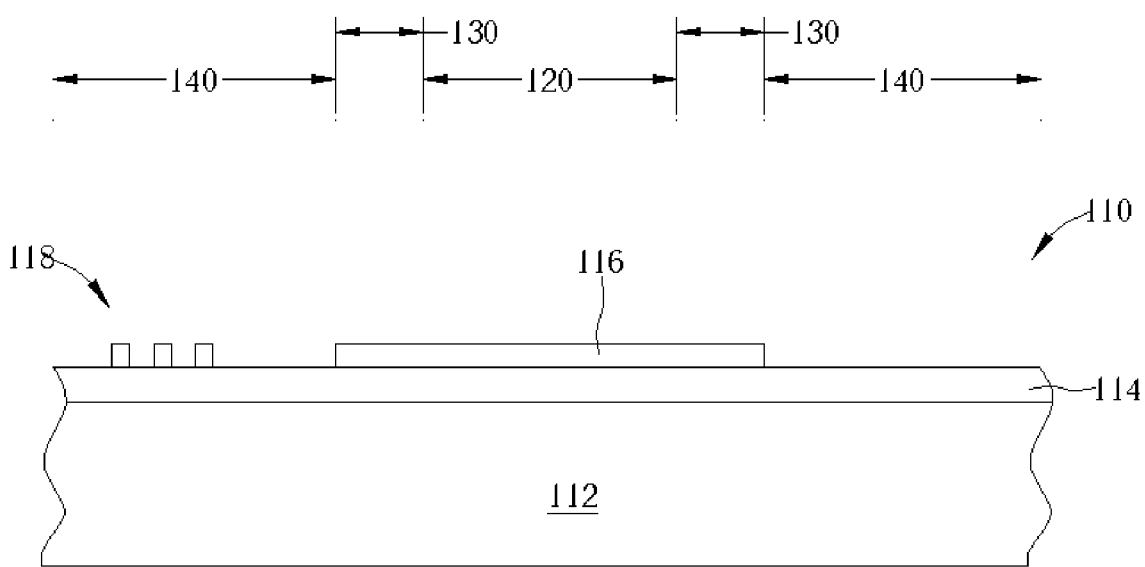

As shown in FIG. 6, a first photo-etching process is performed to pattern the amorphous silicon film 116 and remove parts of the amorphous silicon film 116 in the third region 140 so as to form an alignment mark 118 in the third region 140. The alignment mark 118 comprises at least an uneven structure disposed in the peripheral region which is not used for circuit layout. Therefore, the alignment mark 118 can be recognized clearly by the working machine after performing several deposition processes.

Figure 7:
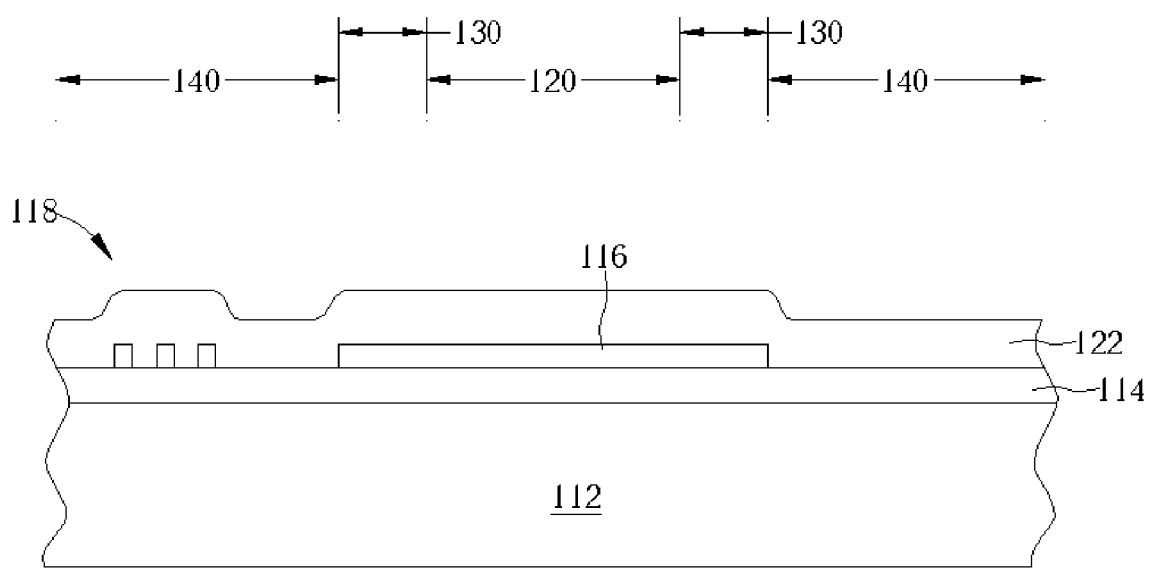

As shown in FIG. 7, a mask layer 122 is formed on the display panel 110 and covering the buffer layer 114, the amorphous film 116 and the alignment mark 118. In the preferred embodiment of the present invention, the mask layer 122 is single layer structure composed of a silicon oxide layer, silicon nitride layer, a silicon-oxy-nitride layer, or a metal layer, or a multi-layer structure composed of the aforementioned materials. According to the materials used in the mask layer 122, a proper process can be used to form the mask layer 122, such as the wellknown LPCVD process, PECVD process or the sputtering process.

Figure 8:
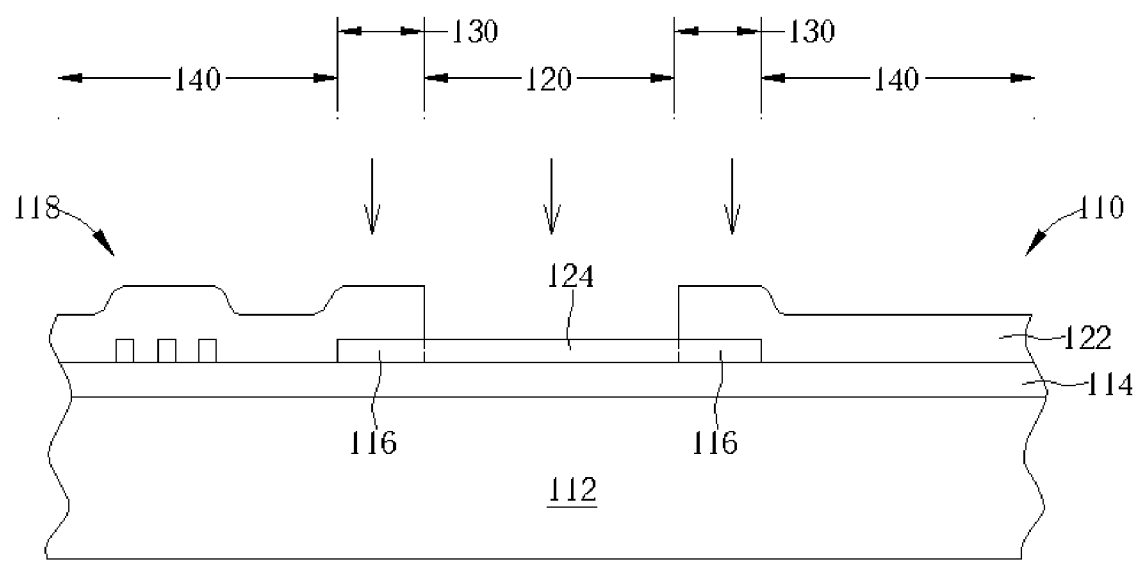

As shown in FIG. 8, a second photo-etching process is performed to remove the mask layer 122 in the first region 120 and expose the amorphous silicon film 116 in the first region 120. Then, the display panel 110 is irradiated by an excimer laser. No matter if a metal layer, which can increases the reflecting rate, or a material with a high thermal conductivity, which can increase the heat dissipation rate, is used in the mask layer 122, this makes the amorphous silicon film 116 in the first region 120 completely melted and the amorphous silicon film 116 in the second region 130 not melted or partially melted. After that, the excimer laser irradiation is stopped so as to make the melted amorphous silicon film 116 crystallize to a polysilicon film 124.

Generally speaking, the excimer laser is generated from the molecules such as XeCl, ArF, KrF, or XeF. Different molecules produce excimer lasers with different wavelengths. The output power of the exicmer laser and the irradiating time can be adjusted according to the thickness of the amorphous silicon film 116. Since the process parameters are not described in detail since those process parameters can be easily obtained by one skilled in the art. It is noted that the excimer laser used in the present invention comprises a conventional short pulse duration laser, which has a period in as range of 20 to 50 ns, and a long pulse duration laser, which has a period in a range of 150 to 250 ns, for increasing the grain size, leading to increase the transporting rate of carriers and improve the electrical performance of the low temperature polysilicon thin film transistor.

Figure 9:
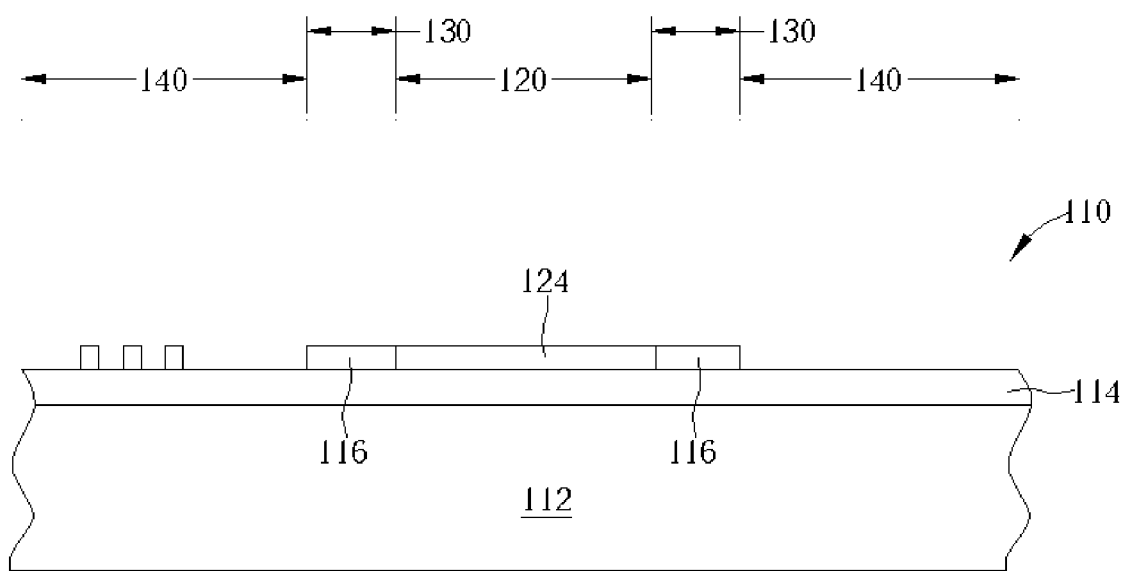

As shown in FIG. 9, an etching process is then performed to remove the mask layer 122 to form a polysilicon island which can be used as an active area of a low temperature polysilicon thin film transistor in latter manufacturing processes of the display panel 110. The latter processes are not described in detail since those should be obvious for one skilled in that field.

According to the aforementioned description, the present invention uses the amorphous silicon film 116 to form the alignment mark 118 so that one deposition process and one lithography process can be omitted. Therefore, the fabricating time and the manufacturing cost can be reduced effectively.

Figure 10:
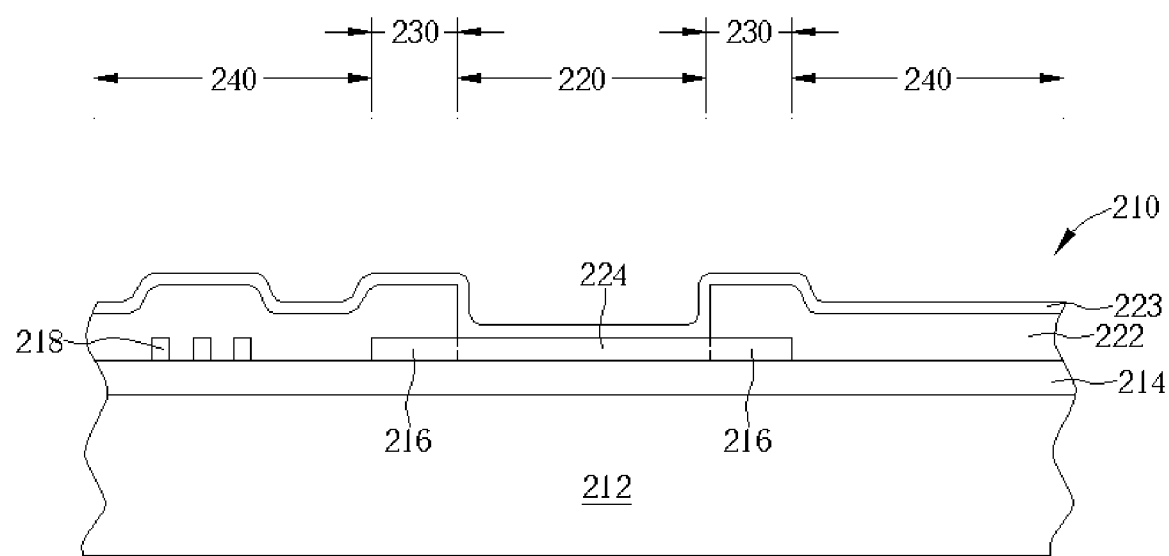
FIG. 10 is a schematic diagram of fabricating a polysilicon film by an excimer laser crystallization process according to a second embodiment of the present invention.

Please refer to FIG. 10, which is a schematic diagram of a method of fabricating a polysilicon film by an excimer laser crystallization process according to a second embodiment of the present invention. The fabricating method of the second embodiment is similar to that of the first embodiment. The only difference is an additional step of forming a heat-retaining capping layer 224 covering the mask layer 222 and the amorphous silicon film 216 after performing the second photo-etching process. Then, the excimer laser irradiation is performed to make the amorphous silicon film 216 in the first region crystallize to a polysilicon film 224. In the same manner, an etching process is followed to remove the mask layer 222 and the heat-retaining capping layer 223. In the preferred embodiment of the present invention, the heat-retaining capping layer 223 comprises a silicon oxide layer, a silicon nitride layer, or a silicon-oxy nitride layer. It can reduce the heat dissipation of the amorphous silicon film 216 so that the melted amorphous silicon film 216 in the first region 220 can be crystallized under a relative higher temperature, leading to increase the grain size of the polysilicon film 224.

Figure 11:
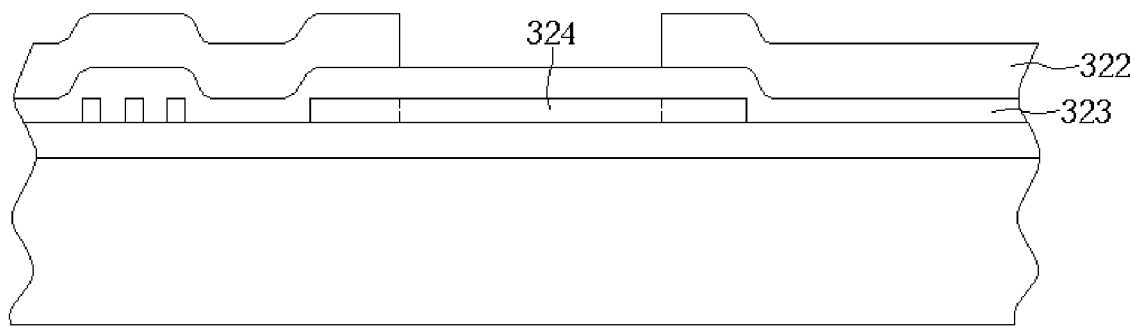
FIG. 11 is a schematic diagram of fabricating a polysilicon film by an excimer laser crystallization process according to a third embodiment of the present invention.

Please refer to FIG. 11, which is a schematic diagram of a method of fabricating a polysilicon film by an excimer laser crystallization process according to a third embodiment of the present invention. The method of this embodiment is the same as that of the second embodiment except the order of the fabricating process. In this embodiment, a heat-retaining capping layer 323 formed before the mask layer 322. In the embodiment mentioned above, both of the mask layer 122 and the mask layer 222 are formed on the amorphous silicon film 116 and the amorphous silicon film 226 directly. Thus, if the bottom of the mask layer 122 or 222 is mainly composed of a metal layer or a silicon nitride layer, the formed polysilicon film may be polluted by the metal layer or peeled due to the stress problem. However, the method according to the first embodiment of the present invention can solve this problem and increase the reliability of the products.

In contrast with the prior art method which forms the alignment mark before fabricating the amorphous silicon film, the present invention integrates the step of patterning the amorphous silicon film and the step of forming the alignment mark so as to simplify the fabricating process and reduce the fabricating time and the manufacturing cost. In addition, the present invention further discloses a method which comprises a step of forming a heat-retaining capping layer and a method which uses a long pulse duration excimer laser to produce the polysilicon film. It not only increases the grain size of the polysilicon film in advance but also solves the conventional problem such as metal pollution or semiconductor film peeling problem so as to increase the electric performance and the reliability of the devices.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of fabricating a polysilicon film by an excimer laser crystallization (ELC) process comprising following steps:
   providing a substrate, the substrate surface defined with a first region, a second region surrounding the first region, and a third region;
   forming an amorphous silicon film on the silicon substrate;
   performing a first photo-etching process to remove parts of the amorphous silicon film in the third region to form an alignment mark in the third region;
   forming a mask layer on the amorphous silicon film;
   performing a second photo-etching process to remove the mask layer on the amorphous film in the first region; and
   performing the excimer laser crystallization process with an excimer laser to make the amorphous film in the first region crystallize to a polysilicon film.

2. The method of claim 1 wherein the substrate further comprises a buffer layer and the amorphous silicon film is formed on the surface of the buffer layer.

3. The method of claim 1 wherein the method further comprises a step of removing the mask layer after forming the polysilicon film.

4. The method of claim 1 wherein the polysilicon film functions as an active area of a thin film transistor.

5. The method of claim 1 wherein the alignment mark is used to increase the alignment ability of photo masks in latter processes.

6. The method of claim 1 wherein the mask layer comprises a silicon oxide layer, a silicon nitride layer, or a silicon-oxy nitride layer.

7. The method of claim 1 wherein the excimer laser excimer crystallization process uses an excimer laser to irradiate the amorphous film to make the amorphous silicon film in the second region, which is covered with the mask layer, become partially melted and make the amorphous film in the first region, which is not covered with the mask layer, become completely melted, and grains are grown laterally toward the first region from the interface between the first region and the second region so as to form a polysilicon film in the first region.

8. The method of claim 1 wherein the excimer laser comprises a long pulse duration laser.

9. The method of claim 8 wherein the period of the long pulse duration laser is in a range of 150 to 250 ns.

10. The method of claim 1 wherein the method further comprises a step of forming a heat-retaining capping layer on the mask layer and the amorphous silicon layer before performing the excimer laser crystallization process to increase the size of the grains in the polysilicon film.

11. A method of forming a polysilicon film by an excimer laser crystallization process, the method comprising following steps:
   providing a substrate, the substrate surface defined with a first region, a second region surrounding the first region, and a third region;
   forming an amorphous silicon film on the substrate;
   performing a first photo-etching process to remove parts of the amorphous silicon film in the third region to form an alignment mark in the third region;
   forming a heat-retaining capping layer covering the amorphous silicon film and the substrate;
   forming a mask layer on the heat-retaining capping layer;
   performing a second photo-etching process to remove the mask layer in the first region; and
   performing the excimer laser crystallization process with an excimer laser to make the amorphous film in the first region crystallize to a polysilicon film.

12. The method of claim 11 wherein the substrate comprises a buffer layer and the amorphous silicon film is formed on the buffer layer.

13. The method of claim 11 wherein the method further comprises a step of removing the mask layer and the heat-retaining capping layer alter forming the polysilicon film.

14. The method of claim 11 wherein the polysilicon film functions as an active area of a thin film transistor.

15. The method of claim 11 wherein the alignment mark is used to increase the alignment ability of photo masks in latter processes.

16. The method of claim 11 wherein the mask layer comprises a silicon oxide layer, a silicon nitride layer, or a silicon-oxy nitride layer.

17. The method of claim 11 wherein the heat-retaining capping layer comprises a silicon oxide layer, a silicon nitride layer, or a silicon-oxy nitride layer.

18. The method of claim 11 wherein the excimer laser crystallization process uses an excimer laser to irradiate the amorphous film to make the amorphous silicon film in the second region, which is covered with the mask layer, become partially melted and make the amorphous film in the first region, which is not covered with the mask layer, become completely melted, and grains are grown laterally toward the first region from the interface between the first region and the second region so as to form a polysilicon film in the first region.

19. The method of claim 11 wherein the excimer laser comprises a long pulse duration laser.

20. The method of claim 19 wherein the period of the long pulse duration laser is in a range of 150 to 250 ns.

* * * * *